US012688342B2

(12) United States Patent
Park et al.

(10) Patent No.: US 12,688,342 B2
(45) Date of Patent: Jul. 21, 2026

(54) DEVICE AND METHOD FOR IMPROVING SIMULATOR PARAMETER

(71) Applicant: Samsung Electronics Co., Ltd., Suwon-si (KR)

(72) Inventors: Chang Hwi Park, Seoul (KR); Chang Wook Jeong, Hwaseong-si (KR); Moon Hyun Cha, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 783 days.

(21) Appl. No.: 17/941,448

(22) Filed: Sep. 9, 2022

(65) Prior Publication Data

US 2023/0169239 A1     Jun. 1, 2023

(30) Foreign Application Priority Data

Nov. 30, 2021     (KR) ........................ 10-2021-0169094

(51) Int. Cl.
| | |
|---|---|
| *G06F 30/27* | (2020.01) |
| *G06N 3/04* | (2023.01) |
| *G06N 3/08* | (2023.01) |
| *G06N 3/126* | (2023.01) |

(52) U.S. Cl.
CPC .............. *G06F 30/27* (2020.01); *G06N 3/04* (2013.01); *G06N 3/08* (2013.01); *G06N 3/126* (2013.01)

(58) Field of Classification Search
USPC ........................................................ 716/111
See application file for complete search history.

(56) References Cited

U.S. PATENT DOCUMENTS

| | | | |
|---|---|---|---|
| 8,543,241 | B2 | 9/2013 | Hong et al. |
| 9,256,371 | B2 | 2/2016 | Franceschini et al. |
| 10,074,054 | B2 | 9/2018 | Adams et al. |
| 10,922,556 | B2 | 2/2021 | Dreyfuss et al. |
| 10,935,603 | B1 | 3/2021 | Ghosal et al. |
| 2020/0143243 | A1 | 5/2020 | Liang et al. |
| 2020/0265032 | A1 | 8/2020 | Lin et al. |
| 2020/0293827 | A1 | 9/2020 | Ghosh et al. |

(Continued)

OTHER PUBLICATIONS

Nikolaus Hansen, et al., "Completely derandomized self-adaptation in evolution strategies," Evol. Comput., 9(2):159-195, Jun. 2001.

(Continued)

*Primary Examiner* — Bryce M Aisaka
(74) *Attorney, Agent, or Firm* — Fish & Richardson P.C.

(57)     ABSTRACT

A device for optimizing and/or improving a simulator parameter of a semiconductor device is provided. The device comprises a memory configured to store an evolution pool, and an input tensor-score pair, and a processor configured to sample a generator network in the evolution pool, initiate a critic network to train the sampled generator network, generate an input tensor from the trained generator network, initiate a simulator to perform a black box operation on the input tensor and to output a score as a result of the operation, and store the input tensor and the score in the memory as a input tensor-score pair, store information used in the black box operation in the evolution pool when the output score is greater than a minimum score, sort the stored information, and update the evolution pool such that only a preset number of information is left in the evolution pool.

9 Claims, 7 Drawing Sheets

(56) References Cited

U.S. PATENT DOCUMENTS

| | | |
|---|---|---|
| 2020/0396148 A1 | 12/2020 | Schibler et al. |
| 2021/0034928 A1 | 2/2021 | Oh et al. |
| 2023/0121843 A1* | 4/2023 | Li ...................... G06F 12/0888 |
| | | 711/118 |

OTHER PUBLICATIONS

K. Deb, et al., "A fast and elitist multiobjective genetic algorithm: nsga-II," IEEE Trans. Evol. Comp, vol. 6, No. 2, pp. 182-197, Apr. 2002.
Goodfellow, et al., "Generative adversarial nets," Advances in neural information processing systems, Jun. 27, 10, 2014.

* cited by examiner

DEVICE AND METHOD FOR IMPROVING SIMULATOR PARAMETER

CROSS-REFERENCE TO RELATED APPLICATION

This application claims priority from Korean Patent Application No. 10-2021-0169094 filed on Nov. 30, 2021 in the Korean Intellectual Property Office, and all the benefits accruing therefrom under 35 U.S.C. 119, the contents of which are herein incorporated by reference in its entirety.

BACKGROUND

Field

The present disclosure relates to a simulator of a semiconductor device, particularly, to a device and a method for optimizing and/or improving a parameter used in the simulator.

Description of Related Art

A semiconductor device is developing toward high specifications and high performance Under development of hardware technology, software technologies to overcome limitations of the hardware technology are being developed. A software architecture in a semiconductor device is complex. There are numerous variables in a module and an algorithm responsible for each function in the semiconductor device. A high-dimensional design space search and verification environment for an optimal and/or improved variable (parameter) in each environment of the semiconductor device is required.

Previously, a design parameter or a verification vector used for design or verification of an electronic device or a semiconductor device have been set based on a developer's intuition. However, even when the parameter is tuned based on an experience and an intuition of an experienced developer or in a trial error scheme, a probability that the tuned value is a local value is very high. Further, because most of parameters are competing or conflicting with each other, it may take an impractically long time to find the optimal and/or improved parameter. Moreover, a parameter determined in this process may cause an undesirable and/or unaccounted for side effect. Thus, if the accuracy of a simulator performing the simulation is low, the performance of a designed and manufactured semiconductor device may be degraded due to inaccurate prediction of the characteristics of the semiconductor device.

A parameter optimizing and/or improvement method is mainly designed based on an open source framework and is being actively studied in machine learning and deep learning fields. In this regard, a black box due is assumed due to system complexity. Parameter optimizing and/or improvement algorithms or methods such as grid search, random search, and Bayesian optimization and/or improvement are used mainly.

SUMMARY

Provided is a method and a device for optimizing and/or improving a simulator parameter that provides a parameter optimized and/or improved for a process, a design, or a verification of a semiconductor device.

The present disclosure provides a method and a device for optimizing and/or improving a simulator parameter capable of tuning an optimized and/or improved parameter in a high-dimensional space.

The present disclosure provides a parameter of a simulation model that is capable of verification of a solution of a semiconductor device and is capable of automation of an optimal design of the semiconductor device, using an evolutionary generation neural network model.

The present disclosure provides a semiconductor device based on a simulation model in which a design thereof is automated, and a solution thereof.

The present disclosure is not limited to the above-mentioned examples. Other examples and advantages according to the present disclosure that are not mentioned may be understood based on following descriptions, and may be more clearly understood based on example embodiments according to the present disclosure. Further, it will be easily understood that the purposes and advantages according to the present disclosure may be realized using means shown in the claims and combinations thereof.

One example of the present disclosure provides a device for improving a simulator parameter of a semiconductor device, the device comprising a memory configured to store an evolution pool and an input tensor-score pair; and a processor configured to sample a generator network in the evolution pool, initiate a critic network to train the sampled generator network in a back-propagation manner, generate an input tensor from the trained generator network, initiate a simulator, trained to output the simulator parameters for a design of the semiconductor, to perform a black box operation on the input tensor and to output a score as a result of the black box operation, and to store the input tensor and the output score in the memory as the input tensor-score pair, store information used in the black box operation in the evolution pool when the output score is greater than a minimum score stored in the memory and sort the stored information, and update the evolution pool such that only a preset number of information is left in the evolution pool.

Another example of the present disclosure provides a simulator parameter improving device connected to a simulator, wherein the simulator parameter improving device comprising: a memory configured to store an input tensor-score pair; and a GEO (Generative Evolution Optimizer) neural network module configured to to initiate a back-propagation training of a generator network using a predicted score calculated from a critic network trained based on the stored input tensor-score pair, initiate the trained generator network to generate an input tensor, perform a black box operation on the generated input tensor, generate a score as a result of the black box operation, store a pair of the input tensor and the generated score in the memory as the input tensor-score pair, store mapping information between the generator network and the generated score in an evolution pool, rearrange the mapping information, and update the evolution pool based on the rearranged information such that only information satisfying a preset condition are left and train the generator network based on the updated evolution pool, and calculate an parameter for the simulator based on the training result, the simulator configured to perform a simulation operation of a semiconductor device.

Other example of the present disclosure provides a method for improving a simulator parameter using a simulator parameter improving device, the method comprising randomly sampling a generator network from an evolution pool, back-propagation training the sampled generator network based on a predicted score calculated from a critic network, generating, by the trained generator network, an input tensor, performing, by a simulator trained to output the simulator parameters for a design of a semiconductor, a black box operation on the input tensor, and calculating a score based on a result of the black box operation, the simulator configured to perform a simulation operation of a semiconductor device, mapping the input tensor and the calculated score with each other when the calculated score is greater than a preset minimum score, storing the input tensor and the calculated score in a memory as an input tensor-score pair, training the critic network based on the input tensor-score pair, storing mapping information between the input-tensor-score pair and the generator network in the evolution pool, rearranging the stored mapping information, and updating the evolution pool based on the rearrangement result.

BRIEF DESCRIPTION OF DRAWINGS

The above and other aspects and features of the present disclosure will become more apparent by describing in detail example embodiments thereof with reference to the attached drawings, in which.

DETAILED DESCRIPTIONS

Figure 1:
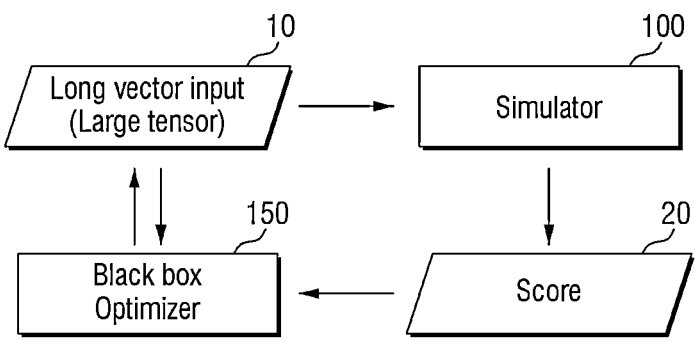
FIG. 1 is a conceptual diagram for illustrating a method for optimizing and/or improving a simulator parameter of a semiconductor device according to some embodiments of the present disclosure.

The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of at least one of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the present disclosure may be partially or entirely combined with each other, and may be technically associated with each other or operate with each other. The embodiments may be implemented independently of each other and may be implemented together in an association relationship.

Terms such as "unit", "module", etc. used in the detailed description and/or functional blocks shown in the drawings may be in and/or implemented in processing circuitry such as hardware, software, or a combination thereof configured to perform a specific function. For example, the processing circuitry more specifically may include (and/or be included in), but is not limited to, a processor (and/or processors), Central Processing Unit (CPU), a controller, an arithmetic logic unit (ALU), a neural processing unit (NPU), a digital signal processor, a microcomputer, a field programmable gate array (FPGA), a System-on-Chip (SoC), a programmable logic unit, a microprocessor, application-specific integrated circuit (ASIC), etc.

A term "program" or "software" refers to any type of a computer code or a set of processor-executable instructions that may be used to program a computer or another processor so as to implement various aspects of embodiments as described in the present disclosure. According to one embodiment, at least one computer program that, when executed, performs methods of as described in the present disclosure need not reside on a single computer or processor but may be distributed, in a module manner, among different computers or processors so as to implement various aspects of embodiments as described in the present disclosure.

The number of verification vectors or design parameters used in an optimizing and/or improving process of design and solution verification of a semiconductor device may be infinitely increased depending on a type of target (e.g., an optimizing target and/or improvement target). For example, assuming that the number of grid points per each dimension is 100, in a three-dimensional structure design, $100^3=1$ million data points occur. Assuming that 10 cases occur per a data point, a total number of cases to be considered in the verification vectors or the design parameters becomes $10^{1000000}$.

Even when the number of parameters exceeds only 100 in a design and verification stage, it is presently impossible to find an optimal verification vector or an optimal design parameter while covering all cases based on an experience and an intuition of an experienced developer or in a trial error scheme. Therefore, a simulation model, trained based on the non-optimized verification vector and/or design parameter, may be unable to efficiently and/or properly converge towards a solution and/or output.

Therefore, it is urgent to optimize a parameter of a simulation model that may calculate data optimized for a semiconductor device or a solution even when input data is unpredictable random data, in a high-dimensional structure.

Hereinafter, with reference to FIG. 1 to FIG. 9, a method for optimizing and/or improving a simulator parameter of a semiconductor device according to some embodiments of the present disclosure will be described.

FIG. 1 is a conceptual diagram for illustrating a method for optimizing and/or improving a simulator parameter of a semiconductor device according to some embodiments of the present disclosure.

Referring to FIG. 1, at least some functions of the semiconductor device may be implemented in a simulator 100. The simulator 100 may be (and/or be implemented in) processing circuitry such as hardware, software, or a combination thereof configured to perform at least some functions of a semiconductor device to be verified and optimized.

The simulator 100 performs any operation on the semiconductor device. When receiving input data 10 (e.g., in a vector form), the simulator 100 outputs output data from an operation of the semiconductor device. The simulator 100 may perform a black box operation on the input data 10. The black box operation may be, for example, an operation that a user may not have knowledge about the internal workings. In some example embodiments, the simulator 100 may also be referred to as a black box. According to some embodiments, the simulator 100 may present output data from the black box operation in a form of a score 20 compared to a preset (and/or otherwise determined) target expected in the semiconductor device. For example, the simulator 100 may output a higher score as the semiconductor device state related to the input data 10 is closer to the target. In some example embodiments, the input data 10 may also be referred to as long vector input.

The input data may be, for example, tensor data in which multi-way data is expressed as a high-dimensional array.

A simulator parameter optimizing device 150 performs simulation on the input data 10, and then identifies the score 20 of the output data, and then searches for the input data having a maximum score. The simulator parameter optimizing device 150 may, for example, search for and/or find input data the results in an optimized and/or improved outcome, and may also be referred to as a black box optimizer. The simulator parameter optimizing device 150 does not know, for example, an objective function that generates the output data based on the input data. Thus, even when there is no analytical expression of the function and/or the expression of the function is complicated, the function may be implemented as a black box function such that the objective function may be approximated based on the input/output data. The simulator parameter optimizing device 150 will be specifically described later with reference to FIG. 2 to FIG. 4.

Figure 2:
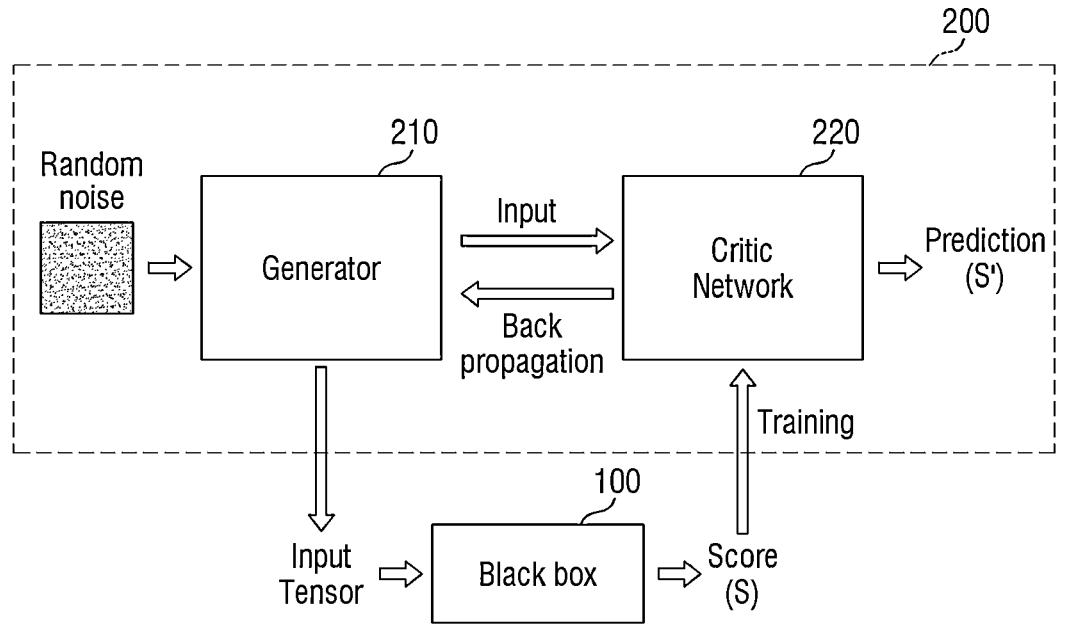
FIG. 2 is a diagram specifically showing a simulator parameter optimizing and/or improving device according to some embodiments.

FIG. 2 is a diagram specifically showing a simulator parameter optimizing device according to some embodiments.

Referring to FIG. 2, a simulator parameter optimizing device 200 is connected to the simulator (e.g., 100 of FIG. 1), and includes a generator module 210 and a critic network module 220. According to some embodiments, the simulator 100 receives the input tensor generated from the generator module 210 and performs a black box operation (and/or operations) based on the input tensor and outputs a score S to the critic network module 220.

According to some embodiments, the generator module 210 includes an evolution pool including at least one generator network, and randomly samples the generator network in the evolution pool to generate a virtual input tensor to be used as the input data 10. The generator network, for example, has almost the same structure as a generator network of Generative Adversarial Network (GAN), a branch of deep learning. The generator network is linked to the critic network module 220 and trained by the backpropagation technique through the critic network module 220.

According to some embodiments, the evolution pool is similar to well-known evolution strategies. The well-known evolution strategies are diverse such as a genetic algorithm, NSGA2, NSGA3, MOEA/D CMA-ES and so on. However, the evolution pool of the embodiments has a pool including at least one elements, the element is sorted based on score and the evolution pool performs filtering the elements every iteration step. The generator network is used as the element of the evolution pool.

According to some embodiments, the generator module 210 receives a predicted score S' as a back-propagation feedback from the critic network module 220. The generator module 210 is trained so as to increase the predicted score of the critic network module 220 and reflects the predicted score so as to generate a next-order input tensor. The critic network module 220 evaluates the output of the generator network, and the generator network is trained based on the evaluation. For example, the training performs to increase or decrease the prediction of the critic network module 220.

The simulator 100 receives the input tensor generated from the generator module 210, performs the black box operation based on the input tensor, and outputs an actual score S as the black box operation result. The critic network module 220 receives the input tensor, perform calculation on the input tensor using a simulated black box function, and thus calculates the predicted score S'. Moreover, the critic network module 220 updates the simulated black box function such that the predicted score S' is closer to the actual score S.

For example, the critic network module 220 may calculate a first predicted score using a first simulated black box function based on a first input tensor used at a first training time, and may calculate a second predicted score using a second simulated black box function based on a second input tensor used at a second training time. A third simulated black box function may be generated from the second simulated black box function using the first and second input tensors and the first and second predicted score data, at a third training time. The third simulated black box function may, for example, be an update operation of the critic network.

In these cases, the evolution pool (storing the generator network of the generator module 210 that generates the first input tensor and the second input tensor) may back-propagation train the generator network based on the predicted score calculated in a previous order. The generator module 210 may newly generate a third input tensor based on the back-propagation trained evolution pool, such that the critic network module 220 may simulate the black box function to produce a predicted score closer to the actual score based on the third input tensor.

The generator module 210 and the critic network module 220 may update the input tensor and the simulated black box function via a certain number of training iterations. For example, when the input tensor-black box function is determined based on accuracy of the predicted score, the input tensor used in the determined black box function may be determined and used as an optimal parameter of the simulator 100.

For example, in the generator module 210 and the critic network module 220, the generator network for generating the input tensor and the critic network for simulating the black box function are cross-trained based on an input tensor-score pair. Thus, a black box function close to an actual black box function may be estimated, and a corresponding optimized (and/or improved) input tensor may be estimated.

Details of a simulator parameter optimizing method are described with reference to FIG. 3.

Figure 3:
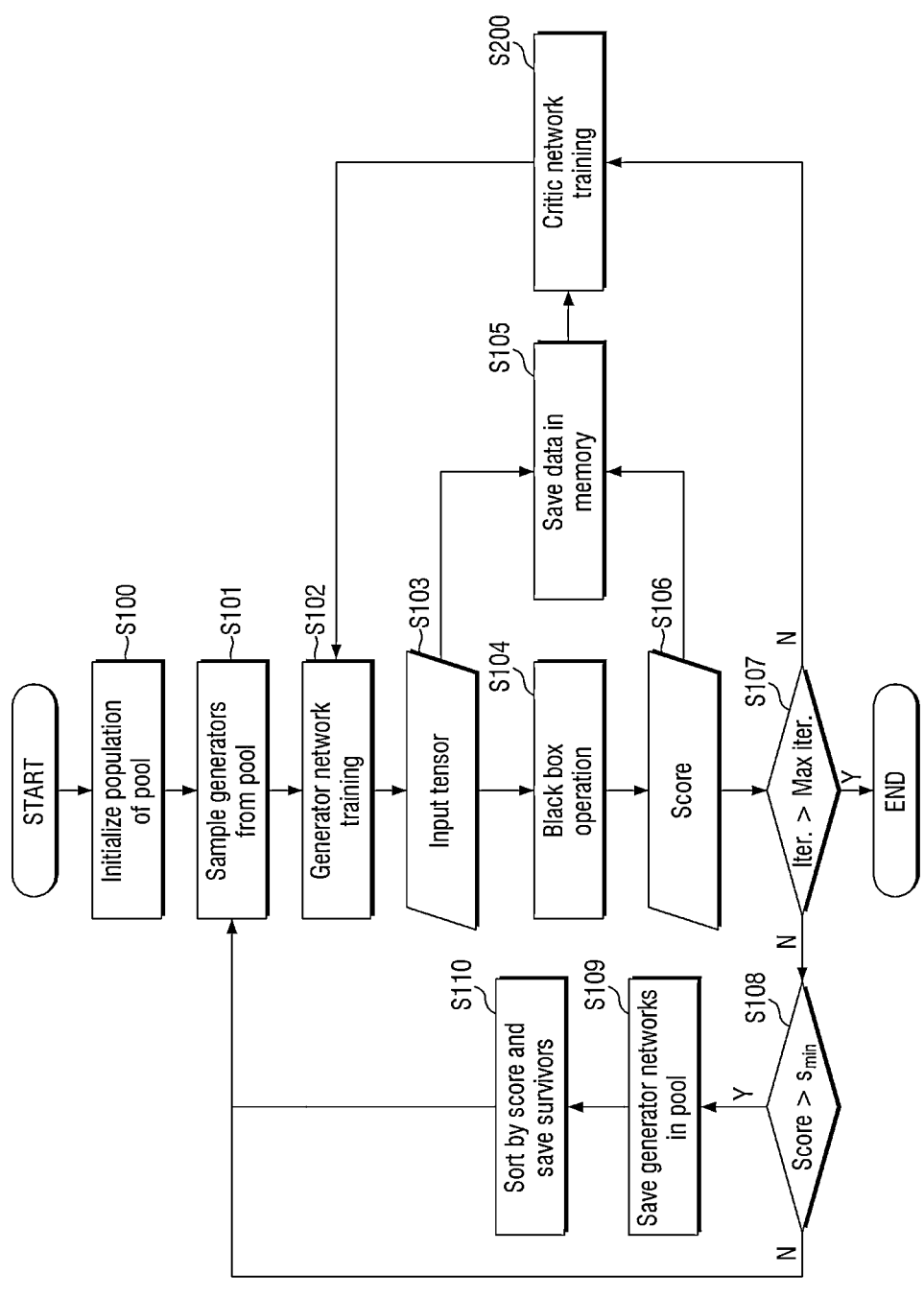
FIG. 3 is a flowchart for illustrating a method for optimizing and/or improving a simulator parameter of a semiconductor device according to some embodiments of the present disclosure.

FIG. 3 is a flowchart for illustrating a method for optimizing and/or improving a simulator parameter of a semiconductor device according to some embodiments of the present disclosure.

Referring to FIG. 3, the simulator parameter optimizing device is based on a GEO (Generative Evolution Optimizer) neural network model. The simulator parameter optimizing device first generates the evolution pool storing therein the generator network, and initializes the generator networks in the evolution pool in S100. The generator network in the evolution pool is randomly sampled in S101, and the sampled generator network is back-propagation trained by an initial critic network generated in S100 or a critic network S200 trained at a previous order in S102.

The generator network trained in S102 generates an input tensor in S103. The input tensor may include, for example, at least one of a design parameter, a verification parameter, and/or a verification vector as an optimization target. For example, the simulator 100 performs black box operation based on the input tensor generated in S103 in S104 and outputs an actual score corresponding to the input tensor in S106.

The simulator parameter optimizing device stores a pair of the input tensor used in S104 and the actual score, e.g., in a memory. According to some embodiments, the memory may store the input tensor-score pairs in, e.g., a time series manner. Alternatively, according to some embodiments, the memory may sequentially store the input tensor-score pairs based on a score level.

Unless the number of training times Iter. of the generator network in S102 does not reach a preset (and/or otherwise determined) maximum number of training times Max Iter. in S107, the simulator parameter optimizing device update and trains the critic network using the input tensor-score pair stored in the memory in S200. The critic network refers to a neural network model trained to simulate an input-output relationship of the black box operation in S104. According to some embodiments, the critic network updates and trains the simulated black box function trained in the previous order so that the predicted score is closer to the actual score, based on the input tensor-score pairs stored in the memory in S200. The critic network trained at a current order is used as a simulated black box function for back-propagation training in S102 of the generator network at a next order training time.

In addition, when the number of training times Iter. does not reach the preset maximum number of training times Max Iter. in S107, the simulator parameter optimizing device compares a minimum score Smin with a current score in S106 calculated at a current order in S108. According to some embodiments, the minimum score Smin may be a preset (and/or otherwise determined) initial minimum score. Alternatively, according to some embodiments, the minimum score may be a score having a minimum value among scores stored in the memory.

When, based on a result of the comparison, the current score is greater than the minimum score Smin (Y in S108), the simulator parameter optimizing device stores information used in the black box operation at the current order in the evolution pool in S109. According to some embodiments, the information stored in S109 may include a generator network in S102, an input tensor in S103, and a score in S106 at the current order. According to some embodiments, the generator network, the input tensor, and the score may be stored in association with each other. For example, information such as the input tensor and the generator network corresponding to the calculated score, a storage time (e.g., an order or a timestamp), etc. may be mapped to each other and the mapping may be stored. However, when the current score is smaller than the minimum score, S109 and S110 are not performed but the generator network is randomly sampled again in S101.

According to some embodiments, the simulator parameter optimizing device may sort information stored in the evolution pool S110. According to some embodiments, the information stored in the evolution pool in S101 may be sorted based on a score level. The information may be sorted in a descending order from the maximum score Smax. In this regard, only the preset (and/or otherwise determined) number of information in the descending order from the maximum score Smax may be left, and the rest thereof may be deleted.

Alternatively, according to some embodiments, when the black box operation or the generator network is stochastic, the simulator parameter optimizing device may recalculate the score of the evolution pool every predefined (and/or otherwise defined) period in S110 and thus may rearrange the stored information based on the recalculation result and may store only information meeting a preset (and/or otherwise determined) condition (pool refresh). Alternatively, according to some embodiments, the simulator parameter optimizing device may delete a preset (and/or otherwise determined) number of information in the oldest order based on a time at which the information is stored in the evolution pool (age evolution).

Alternatively, according to some embodiments, the simulator parameter optimizing device may sort information in the newest order based on a time at which the information is stored in the evolution pool, and may leave information having the storing time after a preset (and/or otherwise determined) time, and may delete information having storing time before the set time. Alternatively, according to some embodiments, the simulator parameter optimizing device may additionally perform random mutation on the information stored in the evolution pool and may sort the randomly mutated information.

S101 of the random sampling of the generator network to S106 of the calculating of the score, S200 of training the critic network, and/or S108 to S110 of evolving the evolution pool may be iterated using the evolution pool modified in S110 until the number of training times Iter. reaches the set maximum number of training times Max Iter. in S107.

According to some embodiments, when the number of training times Iter. reaches the set maximum number of training times Max Iter. (Y in S107), the simulator parameter optimizing device may terminate the training and may determine the generator network calculated based on the trained evolution pool and the trained critic network, and may calculate optimal input tensor data corresponding to the optimizing (and/or improvement) target from the determined generator network.

The simulator parameter optimizing device may perform the evolution pool training and the training of the black box optimizer complementarily with each other without initial training data to stably extract the input data with the highest score (e.g., the optimized parameter). In addition, the simulator parameter optimizing device may perform training based on random data without setting a boundary of the input data, so that a search range of the parameter is not limited to a boundary edge. Because the simulator parameter optimizing device uses the neural network, the device may only normalize a data value as data preprocessing to achieve better performance For example, the data may be normalized such that an average of a data space may be 0 and a distribution thereof may be 1.

Figure 4:
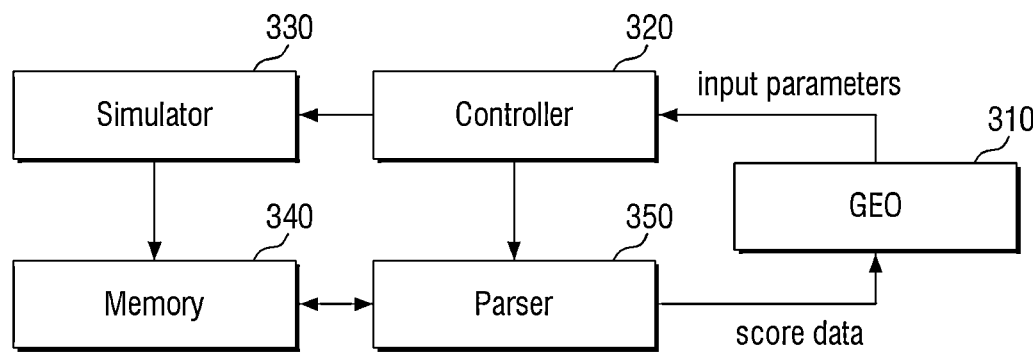
FIG. 4 is a flowchart for illustrating a method for optimizing and/or improving a simulator parameter of a semiconductor device according to some embodiments of the present disclosure.

FIG. 4 is a flowchart for illustrating a method for optimizing and/or improving a simulator parameter of a semiconductor device according to some embodiments of the present disclosure.

Referring to FIG. 4, the simulator parameter optimizing device may include a GEO neural network module 310 and may be connected to a black box module. According to some embodiments, the GEO neural network module 310 may perform S100 to S103, S105 to S110, and S200.

The black box module may perform a function to be optimized (e.g., the black box operation). The black box module may include a simulator 330. The simulator 330 may perform a black box operation related to a semiconductor device operation. According to some embodiments, the simulator 330 may be embodied as the simulator 100 of FIG. 1.

According to some embodiments, the simulator parameter optimizing device may further include a controller 320, a parser 350, and a memory 340. The controller 320 and the parser 350 may perform conversion of input/output data of the simulator 330 when the simulator 330 is implemented as a different type than that of the GEO neural network module 310 and cannot directly interface to the GEO neural network module 310.

According to some embodiments, the controller 320 may convert the input/output data of the simulator 330 into an input tensor and/or convert the input tensor into the input data of the simulator 330. According to some embodiments, the parser 350 may calculate and output a score related to a state of a semiconductor device operation, based on the input/output data of the simulator 330. The memory 340 may store therein the input data (such as the tensor data), the output data (such as a score, time information, etc.) from an operation of the simulator 330, the evolution pool including the generator network, log information, etc. The log information may include, for example, the input data to which the training time of the GEO neural network model 310 is mapped, the score, a history of the generator network, the evolution pool, etc.

For example, the simulator 330 may implement some functions of a DRAM (Dynamic Random Access Memory). The simulator 330 outputs a DRAM state related to an input vector as an output, and outputs a target related to the DRAM state as a single score. As the DRAM state is closer to an expected value, the simulator 330 may output a higher score. In this regard, the input vector may be operation parameters of a simulation model implementing some of functions of the DRAM. According to some embodiments, the memory 340 may store therein the input vector, the DRAM state, the score, and timing information as data or logs.

According to some embodiments, the parser 350 converts the input vector and the DRAM state or the score related to the simulator 330 into data having a data format (e.g., an input tensor and a score) suitable for the GEO module 310, and outputs the converted data. According to some embodiments, the parser 350 may normalize the data as data preprocessing. For example, the parser may normalize the data such that an average of a data space is 0 and a distribution thereof is 1.

The GEO module 310 trains the black box operation performed by the simulator 330 based on the input tensor and the score, and outputs the input tensor with a maximum score based on the trained black box. The controller 320 converts the input tensor output from the GEO module 310 to data having a data format adapted to interface of the simulator 330, and outputs the modified input vector to the simulator 330.

Alternatively, according to some embodiments, the parser 350 may delete the oldest data and/or log from previously stored data in the memory 340 as the simulator 330 performs the black box operation based on the modified input vector.

Figure 5:
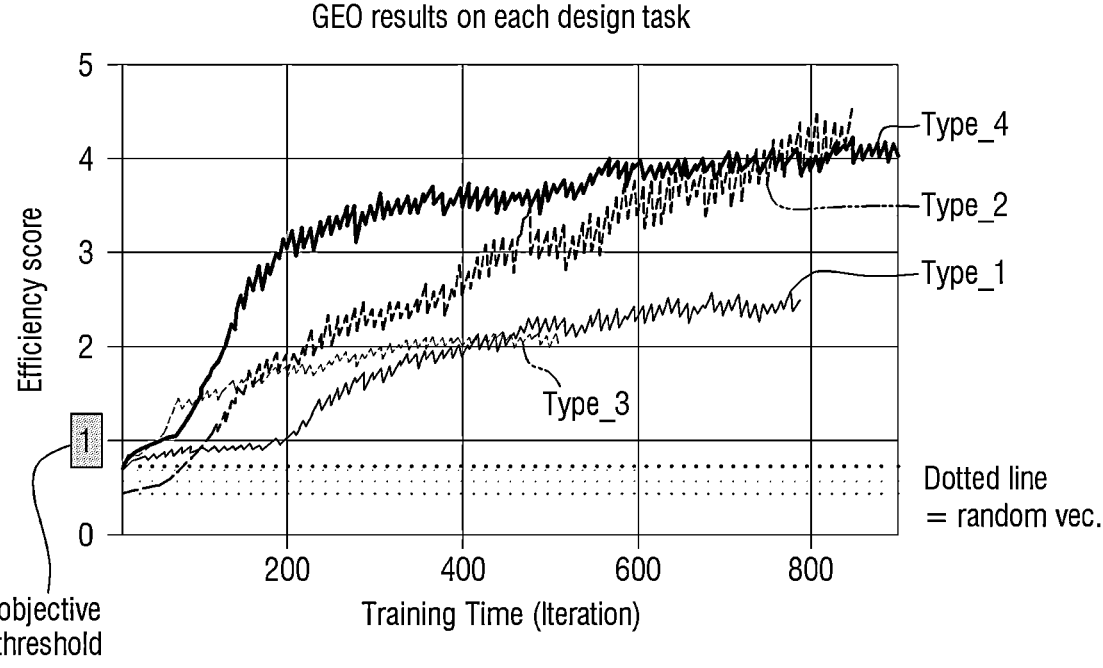
FIG. 5 is a graph showing a simulation performance result according to the simulator parameter optimizing and/or improving device of FIG. 4.

FIG. 5 is a graph showing a simulation performance result according to the simulator parameter optimizing device of FIG. 4.

Referring to FIG. 5, the simulator parameter optimizing device is applied to efficiency optimization of a DRAM (Dynamic Random Access Memory) simulator. According to an embodiment, a score objective threshold is normalized to 1 (score=1.0) in comprehensive consideration of a preset verification goal and a score of a randomly generated input vector. Different types Type 1 to Type 4 refer to different settings of a simulation model of the simulator 330. A high-dimensional space in which the number of parameters is 10000 is set.

The simulator may act as the black box, and thus an experiment is conducted without the user knowing an internal operation principle thereof.

All of type 1 to type 4 obtain a score result that exceeds the score threshold 1.0, using the GEO module 310 and with about 200 iterative training times. On the contrary, when machine learning is performed using only a randomly generated input vector without using the GEO module 310, the score result is below the threshold score even when iterative training times greater than 800 times are executed.

Figure 6:
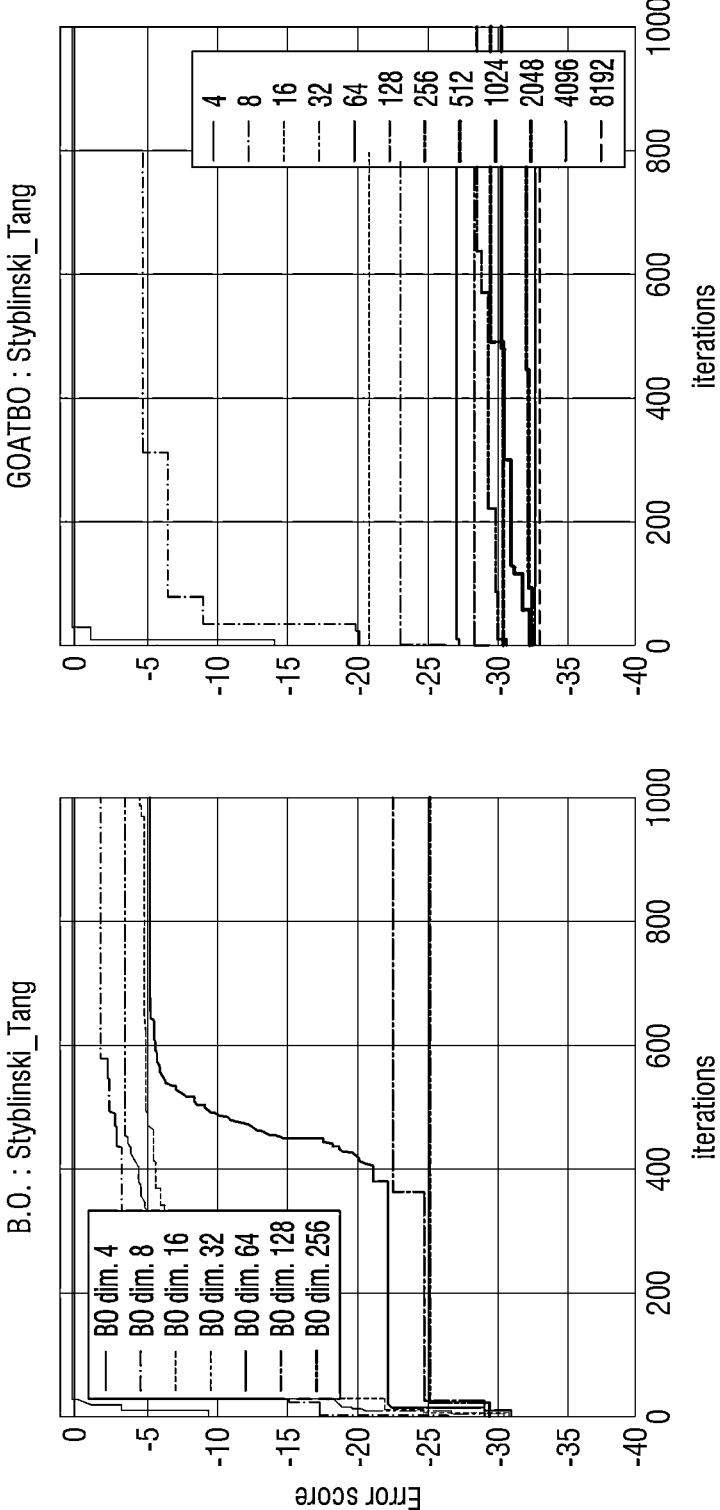
FIG. 6 is a graph showing an experimental result according to a method for optimizing and/or improving a parameter of a semiconductor device according to a Comparative Example.
Figure 7:
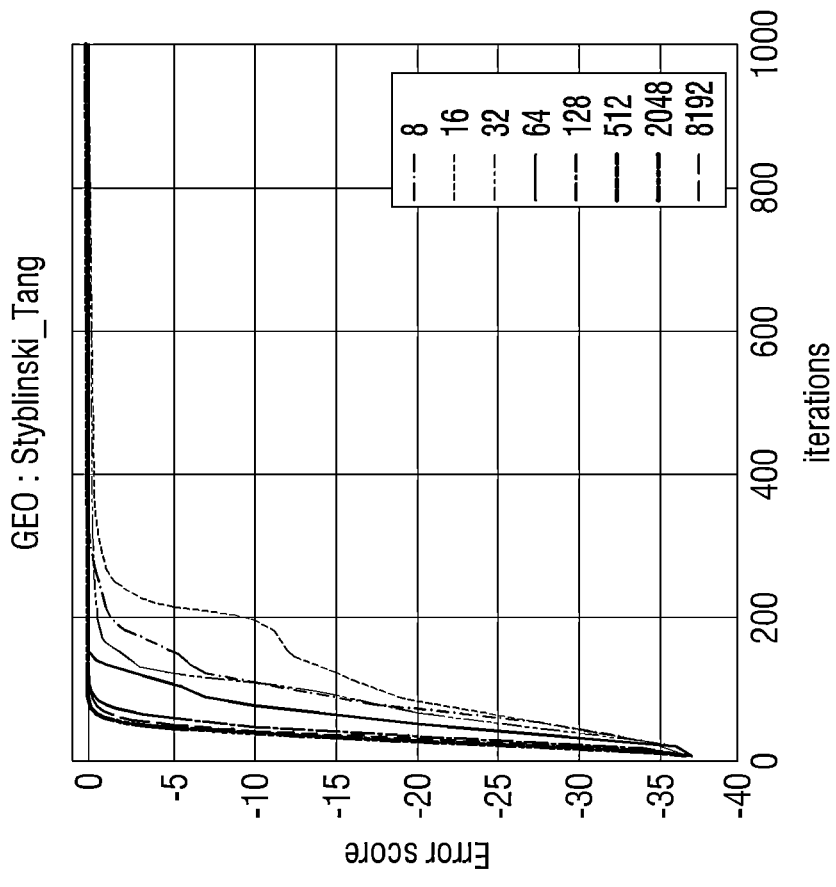
FIG. 7 is a graph showing an experimental result according to a method for optimizing and/or improving a parameter of a semiconductor device according to some embodiments of the present disclosure.

FIG. 6 is a graph showing an experimental result according to a method for optimizing and/or improving a parameter of a semiconductor device according to Comparative Example. FIG. 7 is a graph showing an experimental result according to a method for optimizing and/or improving a parameter of a semiconductor device according to some embodiments of the present disclosure. The Comparative Example employs a Bayesian optimization model.

Referring to FIG. 6 and FIG. 7, a test function (e.g., a Styblinski-Tang function) capable of Bayesian optimization is tested while increasing a dimension of a parameter. Referring to a left graph of FIG. 6, when the Bayesian optimization is used, an error score tends to drop further to a negative value as the dimension increases (4 dimension to 256 dimension). For example, in 128 dimension or 256 dimension, the score converges to −30 or −25 even when iterative training times smaller than 200 is executed.

Moreover, referring to a right graph of FIG. 6, NSGA2 mixed Bayesian optimization is used. In this case, the test function (e.g., a Styblinski-Tang function) is tested while the dimension of the parameter is set to a range from 4 dimension to 8192 dimension. An error score is zero in a low dimension, for example, in 4 dimension. However, an error score is −30 or below −30 as the dimension increases toward a high dimension.

On the contrary, when using the GEO module 310 as shown in FIG. 7, the error score converges to 0 as the number of the training iteration times increases even though the dimension increases. For example, even in 8192 dimension, when the number of the iterative training times is equal to or greater than 400, the error score converges to 0. Thus, there is little performance degradation.

Figure 8:
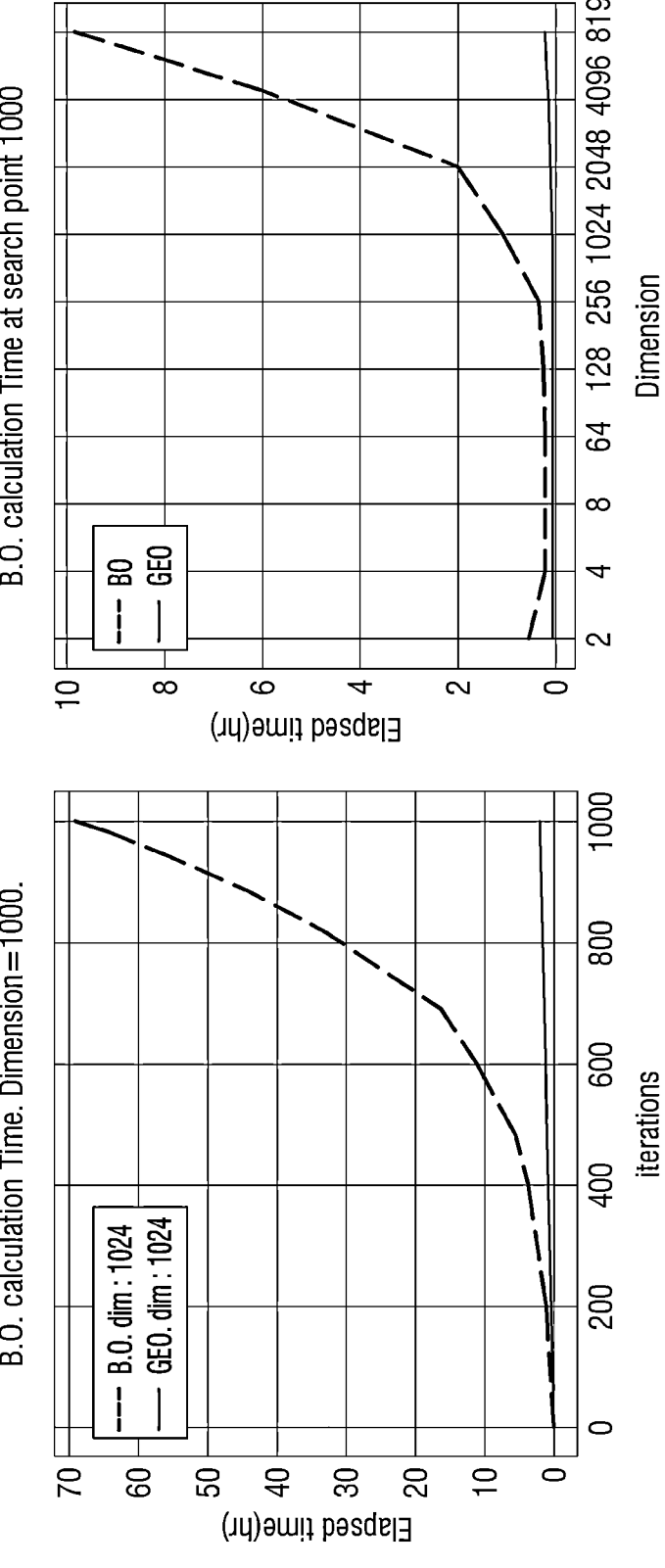
FIG. 8 is a graph of comparison between an optimization experimental result of a Styblinski-Tang test function according to the simulator parameter optimizing and/or improving method according to the Comparative Example and an optimization experimental result of a Styblinski-Tang test function according to the simulator parameter optimizing and/or improving method according to some embodiments of the present disclosure.

FIG. 8 is a graph of comparison between an optimization experimental result of a Styblinski-Tang test function according to the simulator parameter optimizing and/or improving method according to the Comparative Example and an optimization experimental result of a Styblinski-Tang test function according to the simulator parameter optimizing and/or improving method according to some embodiments of the present disclosure.

Referring to FIG. 8, a left graph refers to an elapsed time for performance optimization based on the number of iterations in 1024 dimension. A right graph refers to an elapsed time for performance optimization based on increase in the dimension.

Referring to the left graph, regarding the Comparative Example (B.O.), as the number of iterations increases, a calculation time per iteration increases rapidly. However, regarding the embodiment of the present disclosure using the GEO neural network model, the calculation time per iteration does not increase to a large extent as the number of iterations increases.

Looking at the right graph, regarding the Comparative Example (B.O.), the calculation time per iteration increases rapidly as the dimension increases from 2 dimension to 8192 dimension. However, regarding the embodiment of the present disclosure using the GEO neural network model, the calculation time per iteration is substantially constant even when the dimension increases.

For example, the simulator optimizing device and method according to the embodiments of the present disclosure may find the optimal parameter more quickly without putting a great burden on a system even when a dimension of a parameter is high. For example, when optimizing and/or improving parameters required for design or process simulation of memory devices or system semiconductors, tuning of many parameters is required to perform one function. In this case, the simulator parameter optimizing and/or improving method according to some embodiments may search for an optimal parameter in a faster and more efficient manner.

Figure 9:
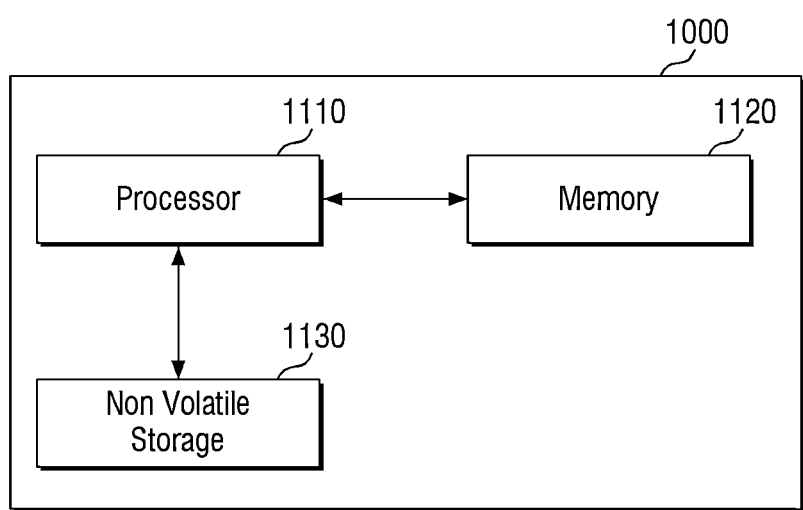
FIG. 9 is a graph showing a device for optimizing and/or improving a simulator parameter of a semiconductor device according to some embodiments of the present disclosure.

FIG. 9 is a graph showing a device for optimizing and/or improving a simulator parameter of a semiconductor device according to some embodiments of the present disclosure.

Referring to FIG. 9, a simulator parameter optimizing device 1000 may include a processor 1110, at least one memory 1120, and at least one non-volatile storage device 1130.

According to some embodiments, the simulator parameter optimizing device 1000 may be applied to, for example, to at least one simulation device in computing devices that perform various calculation functions, such as a robot device such as a drone, and an advanced drivers assistance system (ADAS), smart TVs, smartphones, medical devices, mobile devices, image display devices, measurement devices, IoT (Internet of Things) devices, etc. In addition, the device 100 may be mounted on at least one of various types of electronic devices.

The processor 1110 may read data from the memory 1120 or the non-volatile storage device 1130 or write processed data thereto. For example, the processor 1110 may be implemented as a central processing unit (CPU), a microprocessor, or a CP (Communication Processor).

The memory 1120 or the non-volatile storage device 1130 may store therein data and commands executable by the processor 1110.

The memory 1120 may act as an operation memory and temporarily store therein received data, command calculation results, or device-related information. According to example embodiments, the memory 1120 may include a buffer memory. According to some embodiments, the memory 1120 may include a cache, ROM (Read Only Memory), PROM (Programmable Read Only Memory), EPROM (Erasable PROM), EEPROM (Electrically Erasable Programmable Read-Only Memory), PRAM (Phase-change RAM), a flash memory, SRAM (Static RAM), DRAM (Dynamic RAM), etc.

The non-volatile storage device 1130 may include, for example, a flash memory, or a resistive memory such as a ReRAM (resistive RAM), a PRAM (phase change RAM), an MRAM (magnetic RAM), etc. Further, the non-volatile memory device may include an integrated circuit including a processor and RAM, for example, at least one of a storage device or PIM (Processing in Memory).

In order to perform the functions according to some embodiments of the present disclosure as described above in FIG. 1 to FIG. 8, the processor 1110 may execute a processor executable command stored in the memory 1120 or the non-volatile storage device 1130. In one example, the memory 1120 or the non-volatile storage device 1130 may store data resulting from the execution of the command Various concepts of the present disclosure as described above may be implemented using at least one process. Examples thereof (FIG. 1 to FIG. 4) are provided. The steps performed as a portion of each process may be arranged in any suitable scheme. Thus, although the steps are shown in a sequential manner in illustrated embodiments, embodiments may be configured in which the steps are performed in an order other than that as shown, or some steps occur concurrently.

For example, the present disclosure can be used for efficient design or design evaluation of electronic devices and can also be used for semiconductor process optimization. The common characteristics of the above problems are: 1) The dimension of the input variable for optimization (convertible to score) is very large, 2) Observation cost is too high, making it difficult to observe the intermediate state (in fact, only the final state can be observed).

The two characteristics of the problems are the most typical "High-dimensional black-box optimization" in computer science (or mathematical) problem definition. Previously, the high-dimensional black-box optimization that could be used under normal circumstances did not exist, and it was a huge challenge in computer science. However, the present disclosure provides some method and apparatus for solving the high-dimensional black-box optimization problem.

The present disclosure can be applied to the high-dimensional black-box optimization problem, for example:

1. Memory device peak power prediction problem: in semiconductor devices such as DRAM, the peak power value that can occur instantaneously varies depending on which command sequence is input. It is very important to predict in advance what the maximum peak will be because the power peak damages the semiconductor in operation. The present disclosure provides a device and method to predict the maximum possible power peak value and its command sequence. In the present disclosure, the command is the input variable, and the peak power value is the score.

2. Semiconductor Chemical Mechanical Polishing (CMP) process optimization problem: the semiconductor CMP process has more than hundreds of input parameters, and the average value and standard deviation of the process target change depending on the parameter combination. The present disclosure provides that the average value is adjusted to the desired target value and the standard deviation is optimized to decrease. (For example, the CMP parameters are such as CMP brush rotation speed, etc., but since there are too many of these parameters.)

Although embodiments of the present disclosure have been described above with reference to the accompanying drawings, those of ordinary skill in the art to which the present disclosure belongs will understand that the disclosure may be implemented in other specific forms without changing the technical idea and/or essential characteristics of the present disclosure. Therefore, it should be understood that the example embodiments as described above are illustrative in all respects and not restrictive.

What is claimed is:

1. A device comprising:
a memory configured to store an evolution pool and an input tensor-score pair; and
a processor configured to
sample a generator network in the evolution pool,
initiate a critic network to train the sampled generator network in a back-propagation manner,
generate an input tensor from the trained generator network,
initiate a simulator, trained to output a simulator parameter for a design of a semiconductor device, to perform a black box operation on the input tensor and to output an output score as a result of the black box operation, and to store the input tensor and the output score in the memory as the input tensor-score pair,
store information used in the black box operation in the evolution pool when the output score is greater than a minimum score stored in the memory, and
sort the stored information, and update the evolution pool such that only a preset number of information is left in the evolution pool.

2. The device of claim 1, wherein the critic network includes a neural network model trained to simulate an input-output relationship of the black box operation.

3. The device of claim 2, wherein the processor is configured to train the critic network by updating the critic network such that a predicted score calculated through the black box operation on the input tensor is closer to the output score, based on the input tensor-score pair stored in the memory.

4. The device of claim 1, wherein the processor is configured to train the critic network and update the evolution pool until a number of iterations thereof reaches a preset maximum number.

5. The device of claim 4, wherein the processor is configured to determine the generator network generated based on the trained critic network when each of a number of training times of the critic network and a number of updating times of the evolution pool reaches the preset maximum number,
wherein the processor is configured to output input tensor data to the simulator, and
wherein the input tensor data is based on the determined generator network.

6. The device of claim 1, wherein the updating of the evolution pool includes:
sorting the stored information based on a level of the output score,
leaving only the preset number of information in a descending order from a maximum score, and
deleting a remaining portion of the information.

7. The device of claim 1, wherein the updating of the evolution pool includes:
recalculating and rearranging scores of the stored information every set period, and
leaving only information satisfying a preset condition and deleting a remaining portion of the information.

8. The device of claim 1, wherein the updating of the evolution pool includes:

sorting the stored information in an oldest order based on a time at which the information is stored, leaving only information having a storing time thereof after a preset timing, and deleting a remaining portion of the information.

9. The device of claim 1, wherein the information stored in the evolution pool includes the generator network, the input tensor, the output score, and a storing time of the information, and the generator network, the input tensor, the output score, and the storing time are stored in association with each other.

* * * * *